(12) United States Patent
Peng et al.

(10) Patent No.: US 6,633,086 B1
(45) Date of Patent: Oct. 14, 2003

(54) STACKED CHIP SCALE PACKAGE STRUCTURE

(75) Inventors: Yi-Liang Peng, Hsinchu Hsien (TW); Kai-Chiang Wu, Hsinchu (TW)

(73) Assignee: Vate Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/162,910

(22) Filed: Jun. 6, 2002

(51) Int. Cl.$^7$ .......................... H01L 23/48; H01L 23/52
(52) U.S. Cl. ...................... 257/777; 257/686; 257/723; 257/778
(58) Field of Search ............................... 257/777, 686, 257/723, 778

(56) References Cited

U.S. PATENT DOCUMENTS

| | | | | |
|---|---|---|---|---|
| 6,215,193 B1 | * | 4/2001 | Tao et al. | 257/777 |
| 6,337,226 B1 | * | 1/2002 | Symons | 438/109 |
| 6,448,659 B1 | * | 9/2002 | Lee | 257/777 |
| 6,461,897 B2 | * | 10/2002 | Lin et al. | 438/109 |

* cited by examiner

Primary Examiner—David Nelms
Assistant Examiner—Tu-Tu Ho
(74) Attorney, Agent, or Firm—Rosenberg, Klein & Lee

(57) ABSTRACT

The present invention provides a stacked chip scale package structure, wherein a lower chip and an upper chip are stacked on a substrate. Two rows of bonding pads are disposed on each of the upper and lower chips. The bonding pads on the upper and lower chips are parallel arranged. At least a dummy die is disposed below the suspended portion of the upper chip and at the side of the lower chip as a support during wire bonding. A gap is reserved between the dummy die and the lower chip. The present invention utilizes the design of dummy die to resolve the problem of die crack caused by wire bonding of suspended chip. Therefore, the present invention can flexibly adjust the size and installation direction of the upper chip to meet the requirement of substrate layout, and can also shorten the trace length on the substrate to enhance the electric performance thereof.

1 Claim, 4 Drawing Sheets

STACKED CHIP SCALE PACKAGE STRUCTURE

FIELD OF THE INVENTION

The present invention relates to an integrated circuit (IC) package and, more particularly, to an improved chip stacked structure of stacked chip size/scale package (stacked CSP).

BACKGROUND OF THE INVENTION

As shown in FIGS. 1 and 2, in a chip stacked structure of stacked chip size/scale package (stacked CSP, or called multi-chip package, MCP), a lower chip 12 and an upper chip 14 are disposed on a substrate 10. Each interface is bonded together with adhesives 16 and 18. Gold wires 20 are used to connect bonding pads 22 and 24 on the upper and lower chips 14 and 12 to contacts 26 on the substrate 10. A plurality of solder balls 28 are provided below the substrate 10.

In the prior art, the size of the lower chip is larger than that of the upper chip so as to limit the layout of the substrate. Even the size of the upper chip is larger than that of the lower chip, as shown in FIG. 3, in order to let the wire path be the shortest, the bonding pads of the upper and lower chips 14 and 12 are arranged in the same direction, and the upper chip 14 can be larger than that of the lower chip 12 only in the direction without any bonding pad. However, because bonding pads 30, 32, 34, and 36 are suspended, wire bonding cannot be performed. This is because a chip of stacked CSP is very thin, wire bonding of suspended chip will certainly result in die crack. This problem causes that existent chip design has not widespread application, and sometimes the direction of the upper chip cannot be adjusted due to layout difficulty of the substrate.

Accordingly, the present invention proposes a chip stacked structure of stacked CSP to resolve the problems in the prior art.

SUMMARY AND OBJECTS OF THE PRESENT INVENTION

The primary object of the present invention is to provide a package structure having dummy die design to resolve the problem of die crack caused by wire bonding of suspended chip.

Another object of the present invention is to provide a multi-layer CSP structure capable of flexibly adjusting the size and installation direction of the upper chip.

Yet another object of the present invention is to provide a package structure capable of shortening the trace length on the substrate to enhance the electric performance thereof.

According to the present invention, in a stacked CSP structure, an upper chip is disposed on a lower chip. The size of the upper chip can be larger than that of the lower chip. At least a dummy die is disposed below the suspended portion of the upper chip as a support during wire bonding. The dummy die has a thickness commensurate with that of the lower chip. A gap is reserved between the dummy die and the lower chip.

The various objects and advantages of the present invention will be more readily understood from the following detailed description when read in conjunction with the appended drawings, in which:

DETAILED DESCRIPTION OF PREFERRED EMBODIMENT

The present invention is characterized in that dummy dies are disposed below the suspended portion of an upper chip as a support during wire bonding to resolve the problem of die crack caused by wire bonding of suspended chip.

Figure 1:
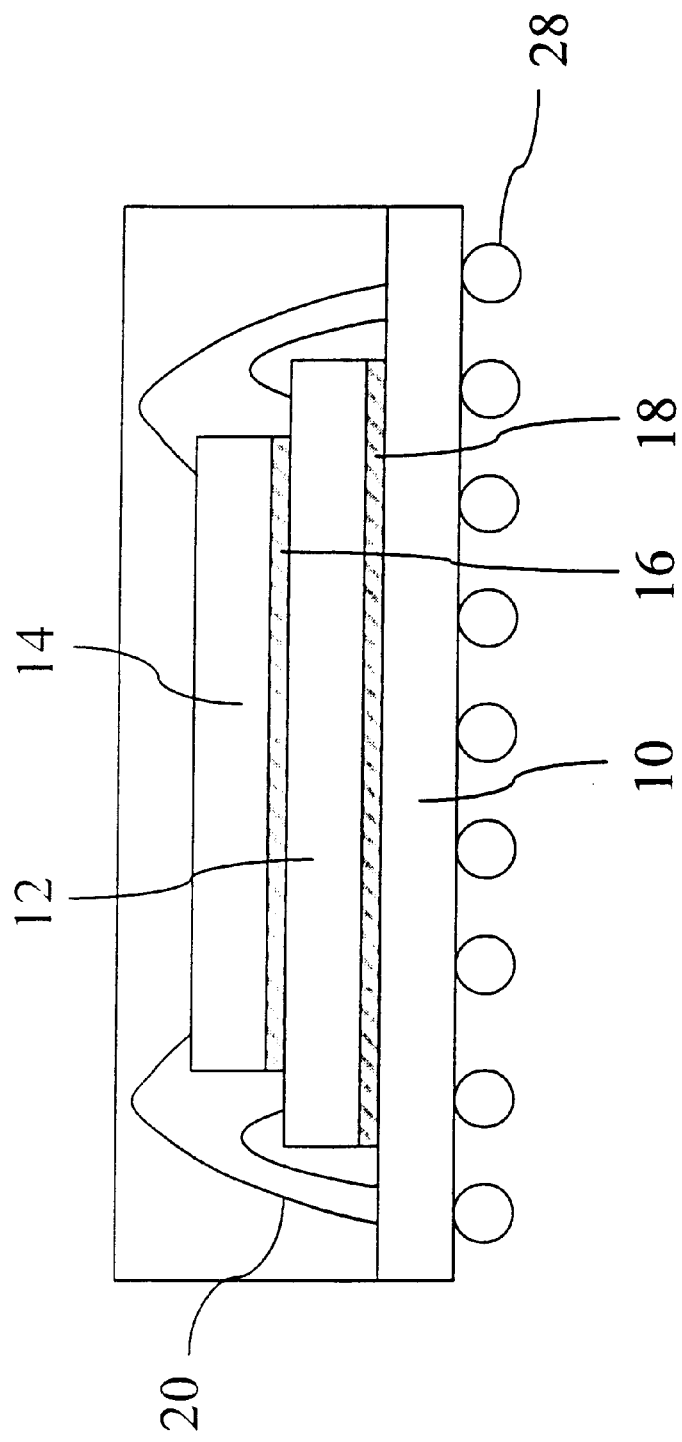
FIG. 1 is a diagram of a stacked CSP structure in the prior art.
Figure 2:
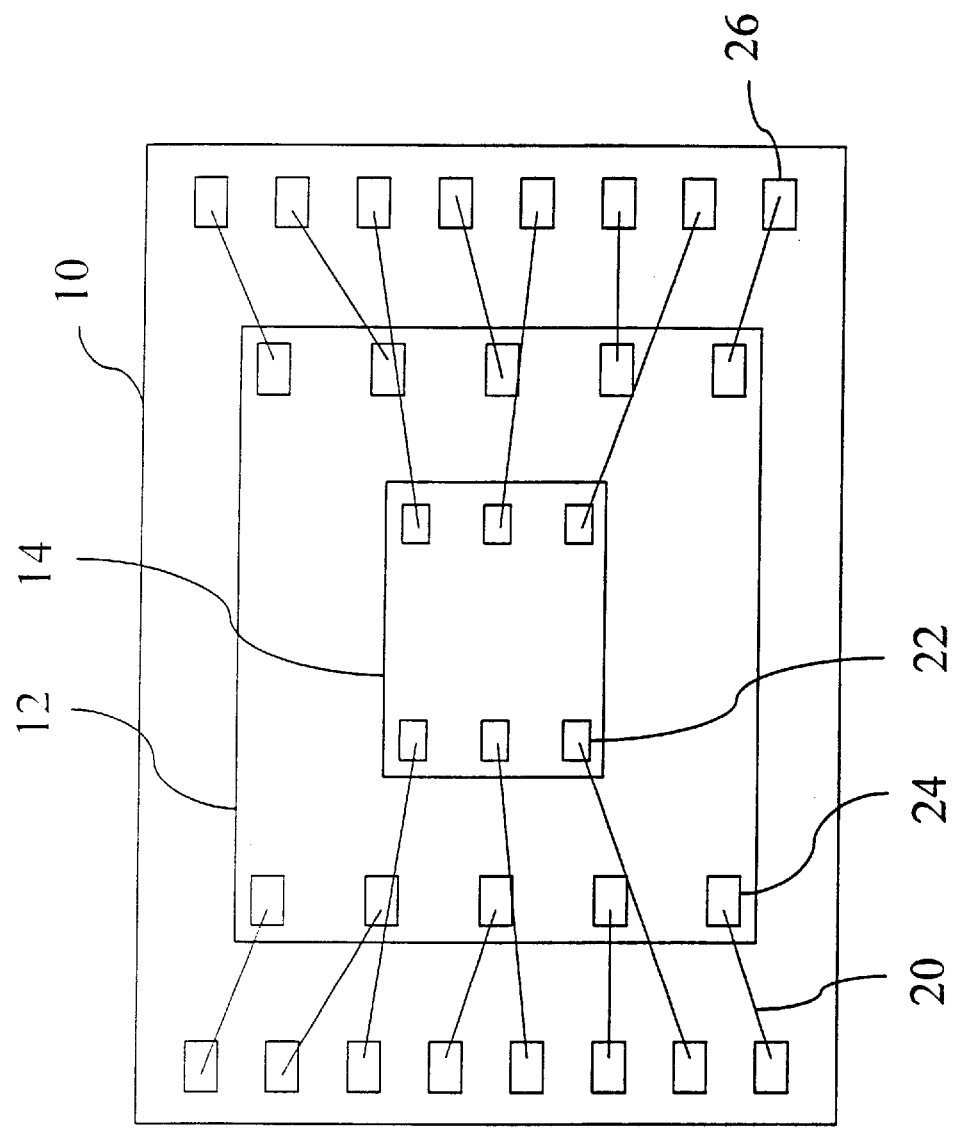
FIG. 2 is a top view of a stacked CSP structure in the prior art.
Figure 3:
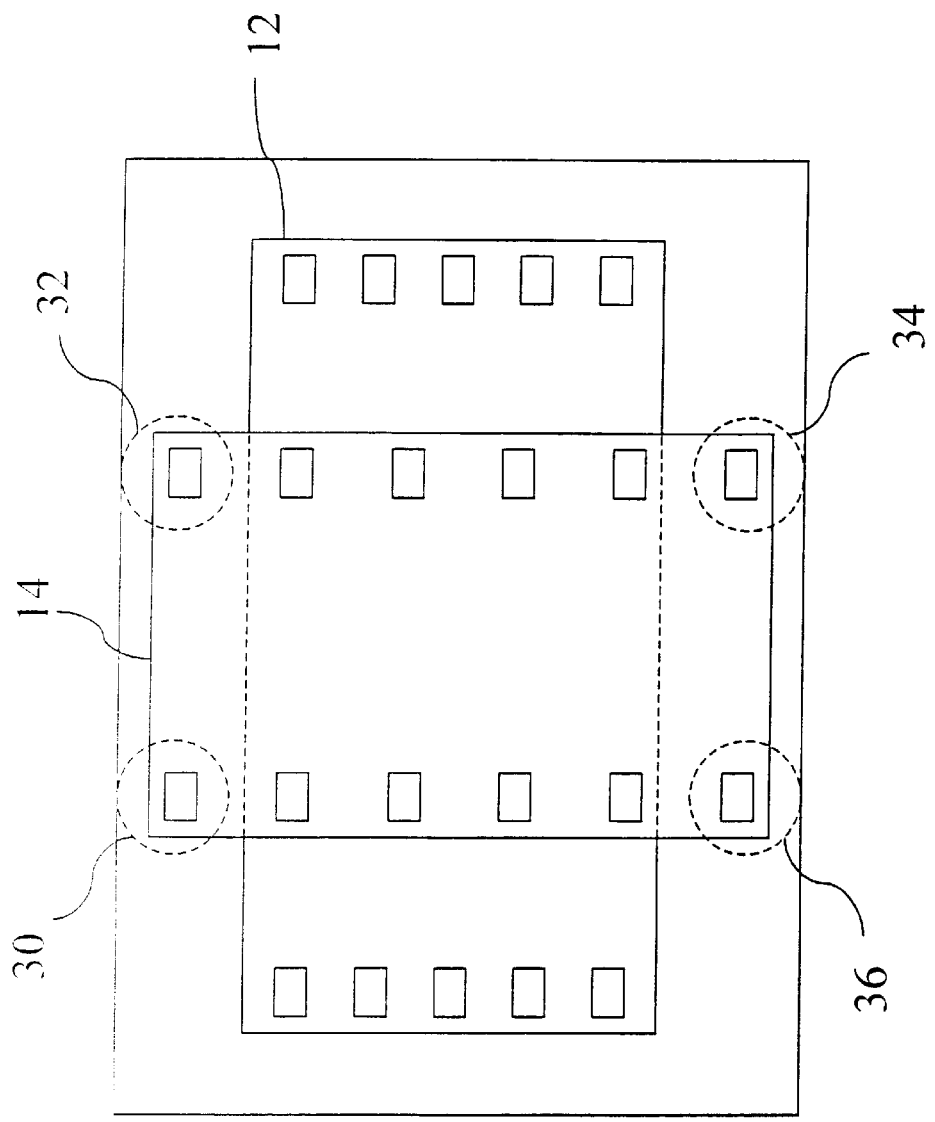
FIG. 3 is a diagram showing wire bonding of a suspended chip in the prior art.
Figure 4:
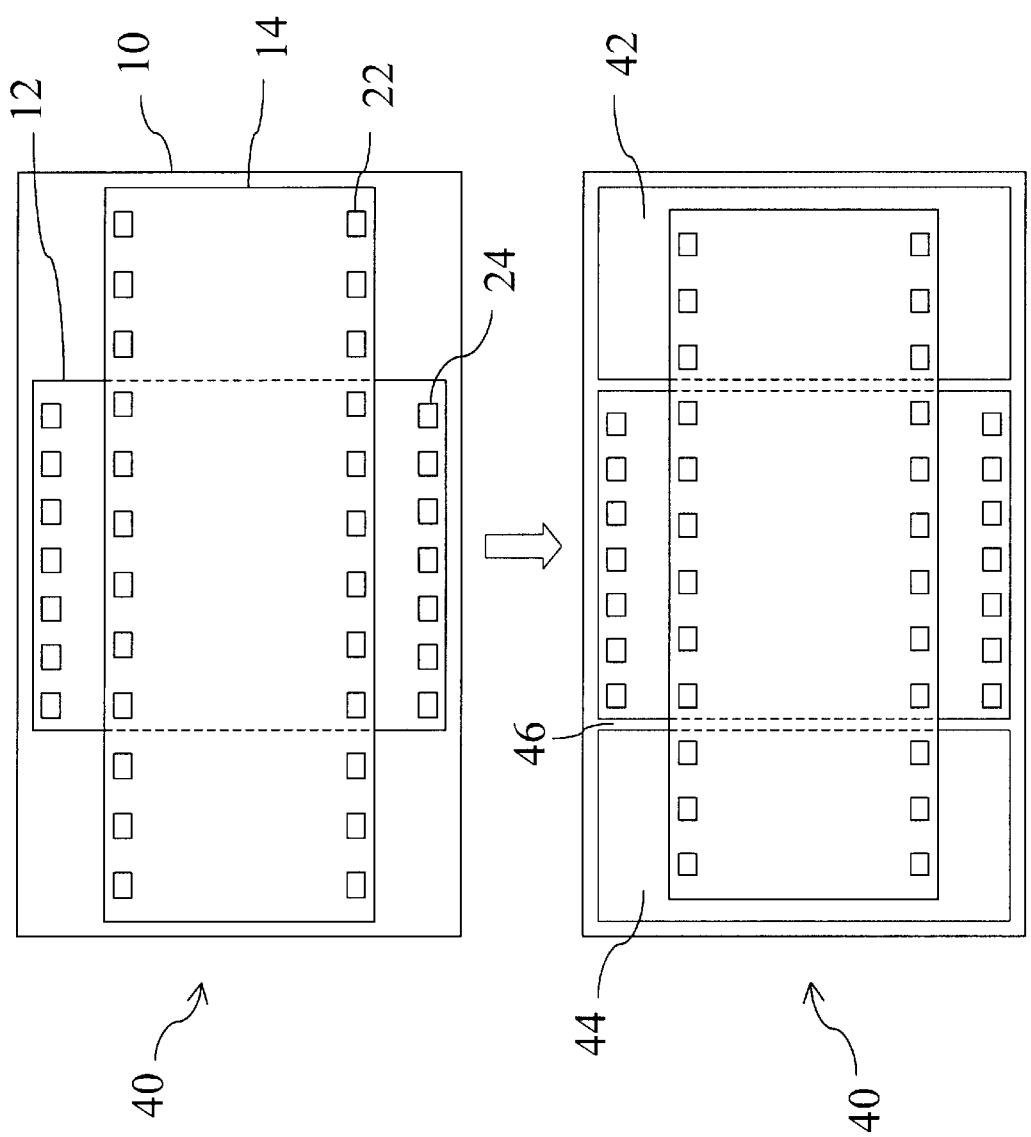
FIG. 4 is a view of the best embodiment of the present invention.

As shown in FIG. 4, in a stacked CSP structure 40, a lower chip 12 and an upper chip 14 are stacked on a substrate 10. Each interface is bonded with adhesive. The adhesive can be silver epoxy. A plurality of bonding pads 22 and 24 are disposed on the upper chip 14 and the lower chip 12, respectively. The size of the upper chip 14 is larger than that of the lower chip 12 along the direction without the bonding pads 22. Therefore, two side regions of the upper chip 14 are suspended relative to the lower chip 12. The bonding pads 22 and 24 are properly arranged two opposite sides of the upper chip 14 and the lower chip 12 so that the two rows of bonding pads 22 of the upper chip 14 are parallel to the two rows of bonding pads 24 of the lower chip 12.

In order to overcome the problem of die crack caused by wire bonding of suspended chip, dummy dies 42 and 44 are disposed below the suspended regions at two sides of the upper chip 14 and on the substrate 10 at two sides of the lower chip 12, respectively. The thickness of the dummy dies 42 and 44 is equal to that of the lower chip 12, and total size of the dummy dies 42 and 44 and the lower chip 12 is larger than the size of the upper chip 14. A gap 46 is reserved between the dummy dies 42 and 44 and the lower chip 12 to reduce expansion and shrink effect due to change of temperature and to reserve space for silver epoxy, thereby enhancing the reliability of package.

If there exists size tolerance between the dummy dies 42 and 44 and the lower chip 12, fluidity and ductility of nonconductive glue or die attach film can be used for compensation. Therefore, the problem of obliquity of the upper chip will not arise. In addition to applying to the stacked technique of two layers of chips, the present invention can also be extended to stacked package of more than three layers or multi-chip set.

To sum up, the present invention is characterized in that dummy dies are disposed below the suspended portion of an upper chip as a support during wire bonding to resolve the problem of die crack caused by wire bonding of suspended chip. In addition to completely resolving the trouble and inconvenience that wire bonding cannot be performed when the upper chip is larger than the lower chip, the present invention can flexibly adjust the size and disposition direction of the upper chip to meet the requirement of substrate layout, and can also shorten the trace length on the substrate to enhance electric performance thereof.

Although the present invention has been described with reference to the preferred embodiments thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims

I claim:

1. A stacked chip scale package structure, comprising:

a lower chip disposed on a substrate;

at least an upper chip disposed on a top portion of said lower chip, at least one portion of said upper chip overhanging a side of said lower chip to define a suspended portion of said upper chip;

at least one dummy die disposed below said suspended portion of said upper chip and being disposed on said substrate at said side of said lower chip to provide inelastic support for said suspended portion of said upper chip, the thickness of said dummy die being commensurate with that of said lower chip; and a plurality of bonding pads properly arranged on exposed surfaces of said upper and lower chips.

* * * * *